(12) United States Patent
Furumiya et al.

(10) Patent No.: US 8,481,399 B2
(45) Date of Patent: Jul. 9, 2013

(54) METHOD OF MANUFACTURING SEMICONDUCTOR DEVICE INCLUDING CAPACITOR ELEMENT PROVIDED ABOVE WIRING LAYER THAT INCLUDES WIRING WITH AN UPPER SURFACE HAVING PROTRUDING PORTION

(75) Inventors: Masayuki Furumiya, Kanagawa (JP); Takeshi Toda, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 0 days.

(21) Appl. No.: 13/244,438

(22) Filed: Sep. 24, 2011

(65) Prior Publication Data

US 2012/0015495 A1 Jan. 19, 2012

Related U.S. Application Data

(62) Division of application No. 12/216,601, filed on Jul. 8, 2008, now Pat. No. 8,039,924.

(30) Foreign Application Priority Data

Jul. 9, 2007 (JP) ................................. 2007-180112

(51) Int. Cl.
*H01L 21/4763* (2006.01)
(52) U.S. Cl.
USPC ...................... 438/396; 438/624; 257/E21.58

(58) Field of Classification Search
USPC ......................................................... 257/535
See application file for complete search history.

(56) References Cited

U.S. PATENT DOCUMENTS 8,030,737 B2 * 10/2011 Oshida et al. ................. 257/532
2007/0034924 A1 2/2007 Takewaki et al.
2008/0217737 A1 9/2008 Oshida et al.

FOREIGN PATENT DOCUMENTS

JP 11-87650 A 3/1999
JP 2007-49089 A 2/2007

* cited by examiner

*Primary Examiner* — Stephen W Smoot
(74) *Attorney, Agent, or Firm* — McGinn Intellectual Property Law Group, PLLC

(57) ABSTRACT

A method of manufacturing a semiconductor device includes forming a first insulating film above a semiconductor substrate, forming a wiring to be buried in the first insulating film, forming a protruding portion in an upper surface of the wiring, forming a second insulating film above the first insulating film and the wiring including the protruding portion, planarizing a surface of the second insulating film, forming a third insulating film on the second insulating film whose surface is planarized, forming a lower electrode on the third insulating film, forming a capacitor insulating film on the lower electrode, and forming an upper electrode on the capacitor insulating film.

12 Claims, 9 Drawing Sheets

METHOD OF MANUFACTURING SEMICONDUCTOR DEVICE INCLUDING CAPACITOR ELEMENT PROVIDED ABOVE WIRING LAYER THAT INCLUDES WIRING WITH AN UPPER SURFACE HAVING PROTRUDING PORTION

The present application is a Divisional Application of U.S. patent application Ser. No. 12/216,601, filed on Jul. 8, 2008, now U.S. Pat. No. 8,039,924 B2, which is based on and claims priority from Japanese patent application No. 2007-180112, filed on Sep. 7, 2007, the entire contents of which are incorporated herein by reference.

BACKGROUND OF THE INVENTION

1. Field of the Invention

The present invention relates to a semiconductor device and a method of manufacturing the semiconductor device. In particular, the present invention relates to a semiconductor device including a MIM element and a method of manufacturing the semiconductor device.

2. Description of the Related Art

Up to now, semiconductor devices including metal-insulator-metal (MIM) elements are described in JP 11-87650 A and JP 2007-49089 A.

JP 11-87650 A describes a semiconductor chip including a memory cell array region and a peripheral circuit region. In the peripheral circuit region of the semiconductor chip, first wiring layers connected with impurity semiconductor regions are formed on an upper surface of an interlayer insulating film. Upper portions of the first wiring layers are covered with cap insulating films. A spin-on-glass (SOG) film is formed on the cap insulating films over the entire surface of a substrate. The SOG film is polished by a chemical mechanical polishing (CMP) method to planarize the surface thereof. Therefore, according to JP 11-87650 A, a focus margin of a subsequent photolithography process can be improved. In the memory cell region, capacitor elements are formed in an upper layer than the polished SOG film.

JP 2007-49089 A describes a technology for improving the reliability of a MIM element even in the case where dishing occurs in a wiring or erosion occurs on an upper surface of the wiring when the MIM element is formed over the wiring. Specifically, the surface of an interlayer insulating film located on the wiring is planarized and then a lower electrode is formed, so the interlayer insulating film and the lower electrode become substantially flat. Therefore, even when a lower layer of the interlayer insulating film has unevenness, a capacitor element can be prevented from being affected by the unevenness. The technology described in JP 200749089 A has a predetermined effect on unevenness caused by recesses resulting from dishing or erosion on the upper surface of the wiring.

As a result of concentrated studies, the inventor(s) of the present invention found a new phenomenon that the reliability of the capacitor element formed over the wiring is reduced because of leakage or the like when protrusions such as hillocks are produced on the upper surface of the wiring.

Hereinafter, a point that protrusions such as hillocks are produced on the upper surface of the wiring in a wiring forming process is described with reference to a specific example.

FIGS. 7A, 7B, 7C, 8A, 8B, and 9 are cross-sectional views showing a process for manufacturing a semiconductor device. FIGS. 7A, 7B, 7C, 8A, 8B, and 9 show steps for forming a copper wiring by a damascene method and then forming a capacitor element over the copper wiring.

As shown in FIG. 7A, trenches are formed in a silicon oxide film (hereinafter, referred to as $SiO_2$ film) 203 and then a barrier metal layer (not shown) for preventing copper diffusion is formed. Subsequently, the trenches are filled with copper by, for example, plating, and then polished by a CMP method to form a copper wiring 205.

Next, a diffusion prevention film 207 for covering the copper wiring 205 is formed on the $SiO_2$ film 203 by a chemical vapor deposition (CVD) method (FIG. 7B), and then an $SiO_2$ film 209 is laminated on the diffusion prevention film 207 (FIG. 7C). Examples of materials for the diffusion prevention film 207 include silicon carbonitride (hereinafter, referred to as SiCN) and silicon carbide (hereinafter, referred to as SiC). The $SiO_2$ film 209 is polished by a CMP method (FIG. 8A). After that, a conductive film, an insulating film 247, and a conductive film 249 are formed in the stated order on the $SiO_2$ film 209 (FIG. 8B) and processed into a predetermined shape to form a capacitor element 221 over the copper wiring 205 (FIG. 9). The capacitor element 221 includes a lower electrode 215, a capacitor insulating film 217, and an upper electrode 219.

When the diffusion prevention film 207 is to be formed by a CVD method during the manufacturing process, a silicon substrate (not shown) is normally heated at approximately 200° C. to 450° C. In this case, it is found that a part of an upper surface of the copper wiring 205 may protrude due to heating, thereby forming a protruding portion 235 (FIG. 7B).

When the protruding portion 235 is formed, a step portion 237 is provided corresponding to the shape of the protruding portion 235 at the time of formation of the diffusion prevention film 207. A cavity portion 241 or a recess portion 243 is provided in the $SiO_2$ film 209 formed on the diffusion prevention film 207 (FIG. 7C). In some cases where such poor film formation of the $SiO_2$ film 209 occurs, the upper surface of the $SiO_2$ film 209 is not sufficiently planarized even after the $SiO_2$ film 209 is polished by the CMP method, so a recess portion 239 is left (FIG. 8A). When the capacitor element 221 is to be formed while the recess portion 239 is left, as shown in FIGS. 8B and 9, a step portion 251, a step portion 253, and a step portion 255 are formed in the conductive film, the insulating film 247, and the conductive film 249, respectively. Therefore, it is likely to cause poor film formation in a part of the insulating film 247, that is, a part of the capacitor insulating film 217 or to reduce a withstanding voltage of the capacitor insulating film 217, thereby causing a leakage defect of the capacitor element 221.

As described above, when the capacitor element 221 is to be formed on the $SiO_2$ film 209 while the $SiO_2$ film 209 is not sufficiently planarized, the reduction in reliability, such as a reduction in withstanding voltage of a part of the capacitor insulating film 217 occurs. This causes a reduction in yield of the capacitor element 221 and the reduction in reliability thereof at the time of use.

In the case where the hillock-shaped protruding portion is produced, even when the technologies of JP 11-87650 A and JP 2007-49089 A which are described in "BACKGROUND OF THE INVENTION" are used, there is still room for improvement in terms of suppressing the reduction in reliability of the capacitor element.

JP 11-87650 A describes the technology for reducing the influence of a step having a relatively large curvature (global step) on an upper layer. The global step is formed in the vicinity of a boundary between the memory cell array region and the peripheral circuit region. Therefore, there is room for improvement in terms of eliminating a local step in the memory cell array region.

The technology described in JP 2007-49089 A is effective for recesses produced by dishing occurring during the CMP of the Cu wiring located under the MIM element, etching or erosion which is caused during cleaning after the CMP, or the like. However, when a part of the upper surface of the Cu wiring becomes a protrusion, the technology may be ineffective. Specifically, as described in JP 2007-49089 A, when the single-layer insulating film is formed on the diffusion prevention film and the surface thereof is planarized by a CMP method, it is necessary to excessively thicken the insulating film in order to eliminate an isolated protrusion such as the protruding portion 235. However, this is unrealistic. The insulating film formed on the protruding portion 235 has a defect just above the protruding portion 235, so a recess may become larger because of the chemical action of the CMP.

SUMMARY OF THE INVENTION

The present invention provides a semiconductor device, including:

a first wiring layer which is provided above a semiconductor substrate and includes a first insulating film and a wiring buried in the first insulating film;

a second insulating film provided above the first wiring layer;

a third insulating film provided on the second insulating film; and a capacitor element provided on the third insulating film, in which:

the capacitor element includes a lower electrode which is provided on the third insulating film, a capacitor insulating film provided on the lower electrode, and an upper electrode provided on the capacitor insulating film; and the wiring includes an upper surface having a protruding portion.

According to the present invention, a MIM capacitor element including the lower electrode, the capacitor insulating film, and the upper electrode is provided above the first wiring layer through the second insulating film and the third insulating film. When such a structure is employed, the flatness of an upper surface of the third insulating film is sufficiently ensured, although the protruding portion is produced in the upper surface of the wiring. Therefore, the capacitor element can be prevented from being affected by the protruding portion of the wiring in the first wiring layer, so a reduction in withstanding voltage of the capacitor insulating film can be suppressed. Thus, the semiconductor device according to the present invention has a structure in which a manufacturing yield of the capacitor element and reliability thereof are excellent.

Further, in the semiconductor device according to the present invention, as viewed from above, the capacitor insulating film overlaps with the wiring and the protruding portion of the upper surface of the wiring may overlap with the capacitor insulating film. Even in such a case, with the semiconductor device according to the present invention, the flatness of the upper surface of the third insulating film is sufficiently ensured. Therefore, the capacitor element can be prevented from being affected by the protruding portion of the wiring of the first wiring layer, so the reduction in withstanding voltage of the capacitor insulating film can be suppressed.

Further, in the semiconductor device according to the present invention, a film thickness of the third insulating film is set to a value equal to or smaller than a film thickness of the second insulating film. Therefore, the entire laminated film including the second insulating film and the third insulating film can be prevented from becoming excessively thick while reduction in reliability of the capacitor element is suppressed. Thus, a plug to be connected with a wiring can be easily formed in the laminated film including the second insulating film and the third insulating film.

The present invention also provides a method of manufacturing a semiconductor device, including:

forming a first insulating film above a semiconductor substrate;

forming a wiring to be buried in the first insulating film;

producing a protruding portion in an upper surface of the wiring;

forming a second insulating film above the first insulating film and the wiring including the protruding portion;

planarizing a surface of the second insulating film;

forming a third insulating film on the second insulating film whose surface is planarized;

forming a lower electrode on the third insulating film;

forming a capacitor insulating film on the lower electrode; and forming an upper electrode on the capacitor insulating film.

According to the manufacturing method, the second insulating film is formed after the protruding portion is produced in the wiring and before the lower electrode of the capacitor element is formed. The formed second insulating film is planarized and then the third insulating film is laminated thereon. Therefore, even when the protruding portion is produced in the wiring under the second insulating film, the upper surface of the third insulating film is planarized to such an extent that the formation of the capacitor element is not affected. Thus, the reduction in withstanding voltage of the capacitor insulating film formed above the protruding portion can be prevented.

According to the present invention, the semiconductor device including the capacitor element whose yield and reliability are excellent and the method of manufacturing the semiconductor device are realized.

DETAILED DESCRIPTION OF THE PREFERRED EMBODIMENT

Figure 1:
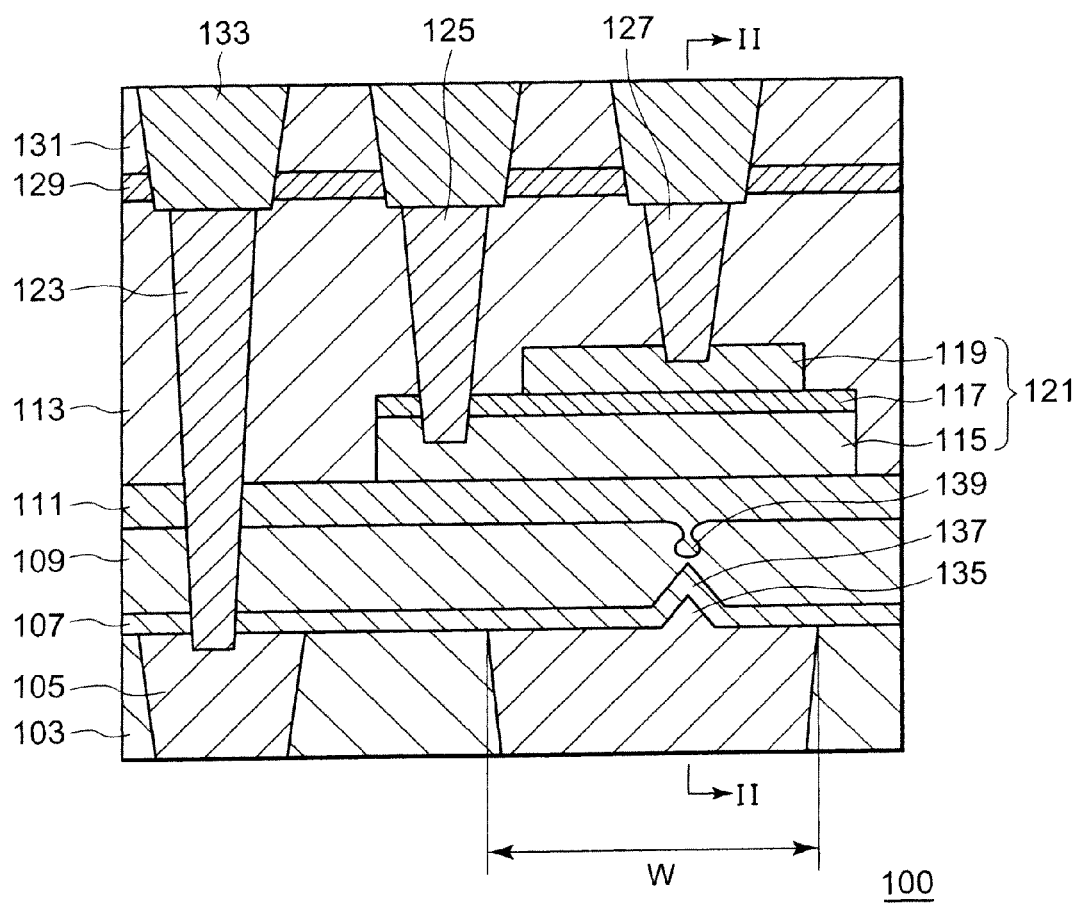
FIG. 1 is a cross-sectional view showing a structure of a semiconductor device according to an embodiment of the present invention.

Hereinafter, a semiconductor device and a manufacturing method thereof according to a preferred embodiment of the present invention are described in detail with reference to the attached drawings. In the drawings, the same elements are expressed by the same reference symbols and thus the duplicated description is omitted here.

FIG. 1 is a cross-sectional view showing a structure of a semiconductor device according to an embodiment of the present invention. A semiconductor device 100 shown in FIG. 1 has a structure in which a first wiring layer (silicon oxide film (hereinafter, referred to as $SiO_2$ film) 103 and first copper (Cu) wirings 105), a second insulating film ($SiO_2$ film 109), a third insulating film ($SiO_2$ film 111), and a capacitor element 121 are laminated above a semiconductor substrate such as a silicon substrate (not shown) in this order. A fourth insulating film ($SiO_2$ film 113) covering the capacitor element 121 is provided on the $SiO_2$ film 111. A second wiring layer (silicon carbonitride (hereinafter, referred to as SiCN) film 129, $SiO_2$ film 131, and second copper (Cu) wirings 133) is provided on the $SiO_2$ film 113.

Figure 2:
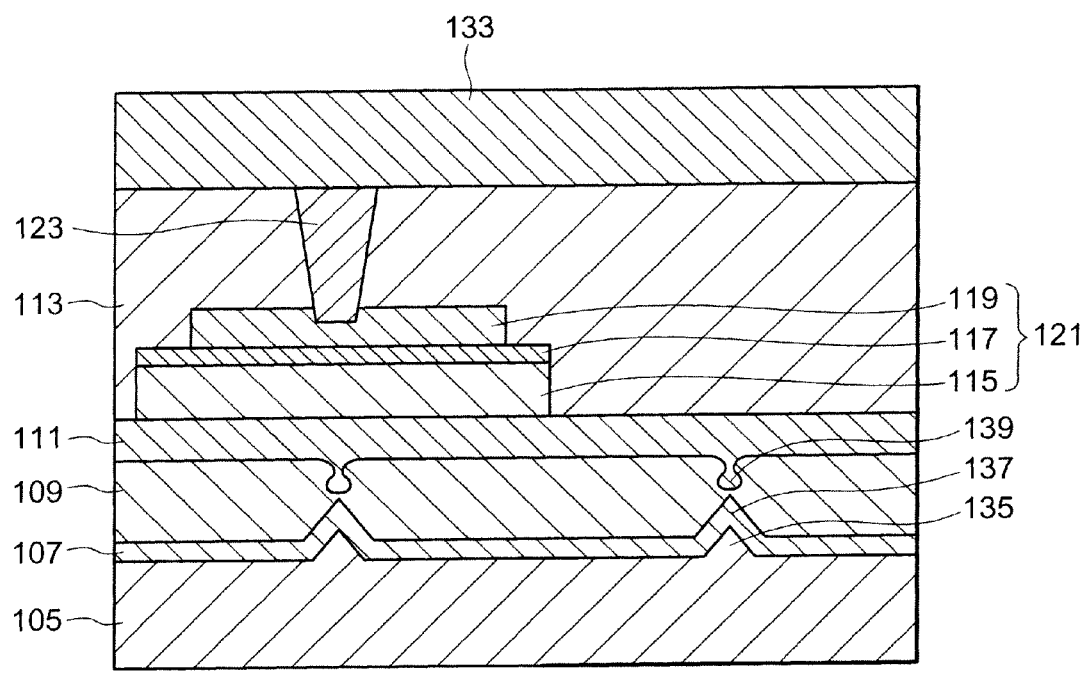
FIG. 2 is a cross-sectional view showing the semiconductor device according to the embodiment of the present invention in a direction parallel to a wiring extending direction, which corresponds to a cross-sectional view along line II-II in FIG. 1.

The first wiring layer includes a first insulating film ($SiO_2$ film 103) and the wirings (first copper wirings 105) buried in the $SiO_2$ film 103. A width of an upper surface of one of the first copper wirings 105 as viewed in cross section is equal to or larger than 1 μm, for example. A barrier metal film (not shown) is provided in an interface between the $SiO_2$ film 103 and each of the first copper wirings 105. FIG. 1 is the cross-sectional view in a direction perpendicular to a direction in which the wirings (first copper wirings 105) extend. A cross-sectional view in a direction parallel to the direction in which the wirings (first copper wirings 105) extend is shown later (FIG. 2).

The capacitor element 121 is a parallel plate type MIM capacitor element and includes a lower electrode 115 provided on the $SiO_2$ film 111, a capacitor insulating film 117 provided on the lower electrode 115, and an upper electrode 119 provided on the capacitor insulating film 117. In a plan view, the upper electrode 119 is smaller in area than the capacitor insulating film 117 and the lower electrode 115 and thus provided above a part of each thereof. An insulating film serving as the capacitor insulating film 117 is provided on the entire surface of the lower electrode 115. Only a portion of the insulating film which is sandwiched between the lower electrode 115 and the upper electrode 119 acts as the capacitor insulating film 117. A portion of the insulating film except the capacitor insulating film 117 acts as an etching stopper film when a first connection plug 125 is formed. The first connection plug 125 is connected with an upper surface side of a portion of the lower electrode 115 over which the upper electrode 119 is not provided. A second connection plug 127 is connected with an upper surface side of the upper electrode 119.

An example of a material of the lower electrode 115 which can be used includes metal such as titanium nitride (TiN), tantalum nitride (TaN), or tungsten nitride (WN). The upper electrode 119 may be made of the same material as the lower electrode 115 or may be different in material therefrom. Examples of a material of the capacitor insulating film 117 include silicon nitride, zirconium oxide, tantalum oxide, and zirconium tantalum oxide. The capacitor insulating film 117 can be formed by CVD or reactive sputtering. The lower electrode 115, the capacitor insulating film 117, and the upper electrode 119 have, for example, a thickness of 100 nm to 300 nm, 5 nm to 20 nm, and 50 nm to 200 nm, respectively.

A region, in which the capacitor insulating film 117 and the upper electrode 119 are provided, faces at least a portion of one of the first copper wirings 105. In other words, as viewed in plan view, at least a portion of the region overlaps with at least the portion of the first copper wiring 105. As viewed from above, the capacitor insulating film 117 of the capacitor element 121 overlaps with the first copper wiring 105 and a protruding portion 135 is produced on an upper surface of the first copper wiring 105 in a position in which the capacitor insulating film 117 overlaps therewith.

The protruding portion 135 is a hillock produced in a portion of the upper surface of the first copper wiring 105. A height of the protruding portion 135 is, for example, 50 nm to 200 nm in the case where a wiring material is a copper-containing metal, as in the case of the first copper wiring 105. A width of the protruding portion 135 as viewed in cross section is, for example, 0.05 μm to 5 μm. A lower surface area of the protruding portion 135 is, for example, 0.025 μm$^2$ to 25 μm$^2$.

An SiCN film 107 serving as a diffusion prevention film is provided between the $SiO_2$ film 103 and the $SiO_2$ film 109. The SiCN film 107 is in contact with the first copper wirings 105 and covers upper portions of the first copper wirings 105. The SiCN film 107 prevents a diffusion of Cu contained in the first copper wirings 105 and also acts as an etching stopper film when a third connection plug 123 is formed, as described later. The SiCN film 107 protrudes to the $SiO_2$ film 109 side in the shape of the protruding portion 135 at the position in which the protruding portion 135 is produced. More specifically, the SiCN film 107 has a step portion 137 produced corresponding to the shape of the protruding portion 135. A thickness of the SiCN film 107 is, for example, 50 nm to 150 nm in a region outside the production region of the protruding portion 135.

A recess portion 139 recessed to a semiconductor substrate (not shown) side is produced in an upper surface of the $SiO_2$ film 109 provided in contact with an upper portion of the SiCN film 107, at the position corresponding to the protruding portion 135. The upper surface of the $SiO_2$ film 109 is a surface polished by a CMP method. A thickness of the $SiO_2$ film 109 is, for example, 100 nm to 400 nm in the region outside the production region of the protruding portion 135.

An upper surface of the $SiO_2$ film 111 provided in contact with an upper portion of the $SiO_2$ film 109 is flat. The lower electrode 115 of the capacitor element 121 is provided on the upper surface of the $SiO_2$ film 111 in contact therewith. The point that the upper surface of the $SiO_2$ film 111 is flat means that the upper surface thereof is flat to the extent that the poor film formation of the capacitor insulating film 117 of the capacitor element 121 is suppressed without any problem in practical use. The upper surface of the $SiO_2$ film 111 which is located above the recess portion 139 is preferably planarized to the extent that a reduction in withstanding voltage resulting from the poor film formation of the capacitor insulating film 117 does not cause any problem in practical use. The upper surface of the $SiO_2$ film 111 may be a surface polished by a CMP method or a surface which is not planarized by a polishing process or the like after the formation thereof.

A film thickness of the $SiO_2$ film 111 is preferably set to the extent that the flatness of the upper surface of the $SiO_2$ film 111 can be sufficiently ensured. For example, the film thickness is 50 nm to 200 nm in the region outside the production region of the protruding portion 135. The film thickness of the SiO₂ film 111 may be equal to or smaller than the thickness of the SiO₂ film 109 in the region outside the production region of the protruding portion 135. Therefore, the sum of the thickness of the SiO₂ film 109 and the thickness of the SiO₂ film 111 is not excessively large.

The second copper wirings 133 are formed over the capacitor element 121. The second copper wirings 133 are buried in the SiO₂ film 131 and the SiCN film 129. One of the first copper wirings 105 and one of the second copper wirings 133 are connected with each other through the third connection plug 123. The lower electrode 115 of the capacitor element 121 and the upper electrode 119 thereof are connected with the second copper wirings 133 through the first connection plug 125 and the second connection plug 127, respectively. In this embodiment, Cu is used as a material of each of the first connection plug 125, the second connection plug 127, and the third connection plug 123 as in the case of the first copper wirings 105 and the second copper wirings 133.

FIG. 2 is a cross-sectional view in a direction parallel to a direction in which the first copper wirings 105 and the second copper wirings 133 extend. Note that FIG. 2 corresponds to a cross-sectional view along line II-II in FIG. 1. The protruding portion 135 is produced in the upper surface of the first copper wiring 105. As viewed from above, the protruding portion 135 may be produced in a position overlapped with the capacitor insulating film 117 or produced in a position which is not overlapped with the capacitor insulating film 117. According to the structure of the semiconductor device in the present invention, even when the protruding portion 135 is produced in the position overlapped with the capacitor insulating film 117 as viewed from above, the capacitor element 121 can be prevented from being affected by the protruding portion 135 of the wiring of the first wiring layer. Therefore, it is possible to suppress the reduction in withstanding voltage of the capacitor insulating film 117.

Next, a method of manufacturing the semiconductor device 100 is be described. A process for manufacturing the semiconductor device 100 includes:

forming the first insulating film (SiO₂ film 103) above the semiconductor substrate (not shown);

forming the wiring (first copper wiring 105) so as to be buried in the SiO₂ film 103;

producing the protruding portion 135 in the upper surface of the first copper wiring 105;

forming the second insulating film (SiO₂ film 109) over the SiO₂ film 103 and the first copper wiring 105 in which the protruding portion 135 is produced;

planarizing the surface of the SiO₂ film 109;

forming the third insulating film (SiO₂, film 111) on the planarized SiO₂ film 109;

forming the lower electrode 115 on the SiO₂ film 111;

forming the capacitor insulating film 117 on the lower electrode 115 in a region including the position overlapped with the protruding portion 135; and forming the upper electrode 119 on the capacitor insulating film 117.

In this embodiment, producing the protruding portion 135 is forming the diffusion prevention film (SiCN film 107) covering the upper portions of the first copper wirings 105 by a chemical vapor deposition (CVD) method.

Hereinafter, each of the above steps is specifically described with reference to FIGS. 3 to 5.

FIGS. 3 to 5 are cross-sectional views showing the process for manufacturing the semiconductor device 100 of FIG. 1.

Figure 3A:
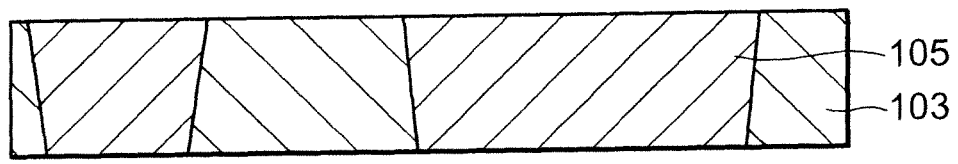
FIGS. 3A to 3C are cross-sectional views showing a process for manufacturing the semiconductor device of FIG. 1.

First, the first wiring layer is formed by a damascene method above the silicon substrate (not shown) formed with predetermined elements such as transistors (FIG. 3A). The SiO₂ film 103 is formed as an interlayer insulating film by chemical vapor deposition (CVD). The upper surface of the SiO₂ film 103 is planarized by a CMP method. Note that, when the upper surface of the SiO₂ film 103 is already flat, this step can be omitted.

Next, photolithography and dry etching are performed to selectively remove predetermined regions of the SiO₂ film 103, thereby forming wiring trenches. Subsequently, the barrier metal (not shown) made of tantalum nitride (TaN) is formed on the entire surface at a film thickness of approximately 30 nm to 50 nm. Then, a Cu seed layer is formed at a thickness of approximately 50 nm to 200 nm and a Cu film is formed thereon at a thickness of approximately 500 nm to 1000 nm by electrolytic plating method. Then, the Cu film is polished by CMP treatment until the upper surface of the SiO₂ film 103 is exposed. Therefore, the first copper wirings 105 are formed (FIG. 3A). At this stage, no steep unevenness occurs in the upper surfaces of the first copper wirings 105 and thus the protruding portion 135 is not produced.

Figure 3B:
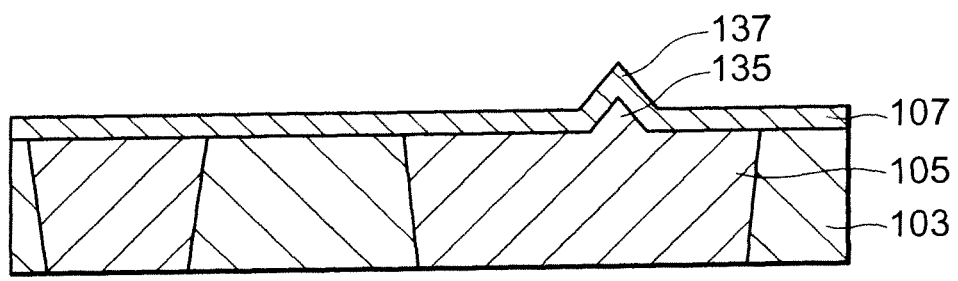

Subsequently, the SiCN film 107 covering the upper portions of the first copper wirings 105 is formed on the SiO₂ film 103 by a CVD method (FIG. 3B). This step includes a step of heating the silicon substrate (not shown) to a temperature of 200° C. to 450° C., more specifically, a temperature of 250° C. to 350° C. As described earlier with reference to FIGS. 7A, 7B, 7C, 8A, 8B, and 9, when the SiCN film 107 is to be grown, a portion of the upper surface of the first copper wiring 105 protrudes to produce the protruding portion 135. In addition to this, the step portion 137 is produced in a position corresponding to the protruding portion 135 of the SiCN film 107.

According to the studies made by the inventor(S) of the present invention, it is found that the frequency of occurrence of the hillock (protruding portion 135) of Cu increases depending on a volume of the first copper wiring 105.

Figure 6:
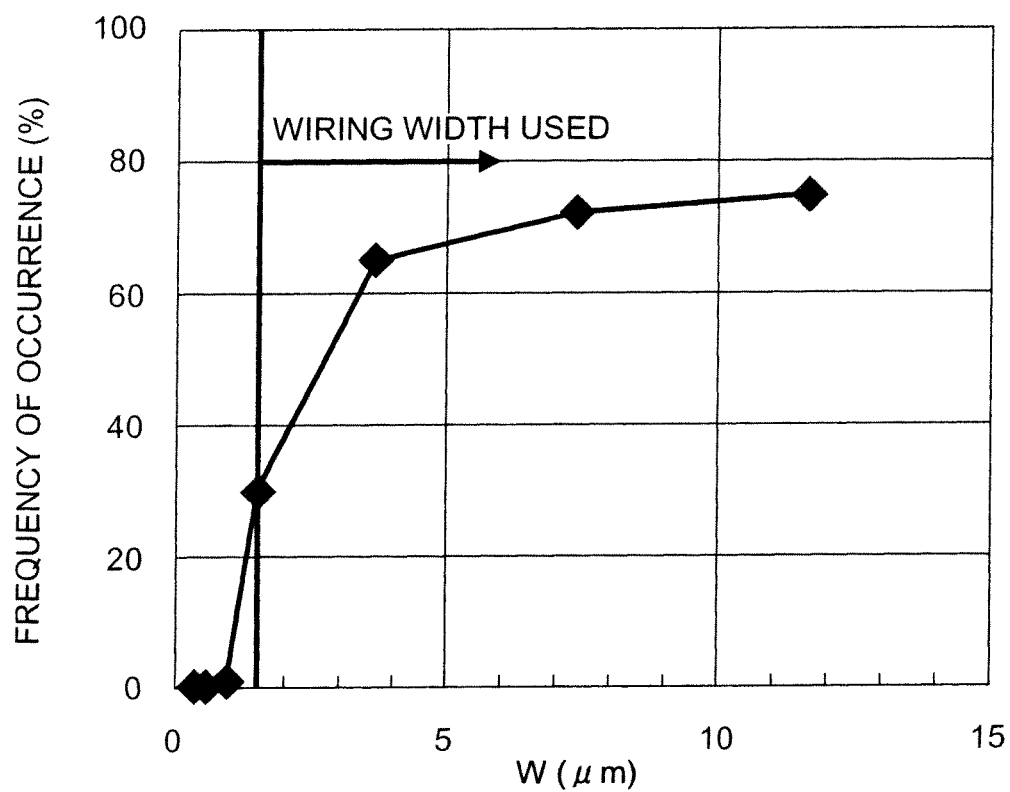
FIG. 6 is a graph showing a relationship between a wiring width and a frequency of occurrence of a hillock in the semiconductor device according to the embodiment of the present invention.
Figure 7A:
FIGS. 7A to 7C are cross-sectional views showing a process for manufacturing a conventional semiconductor device.
Figure 7B:
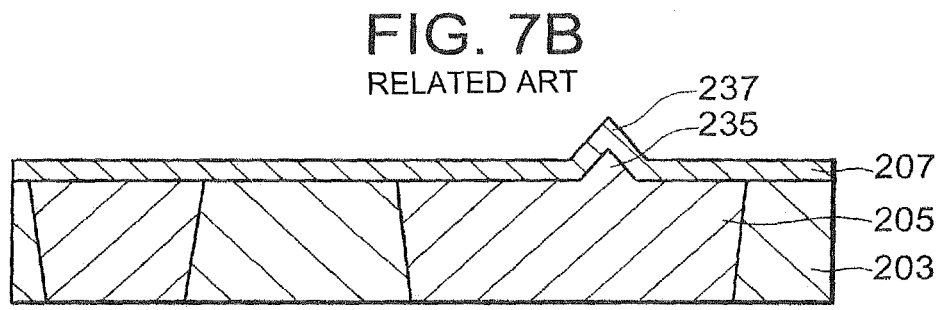
Figure 7C:
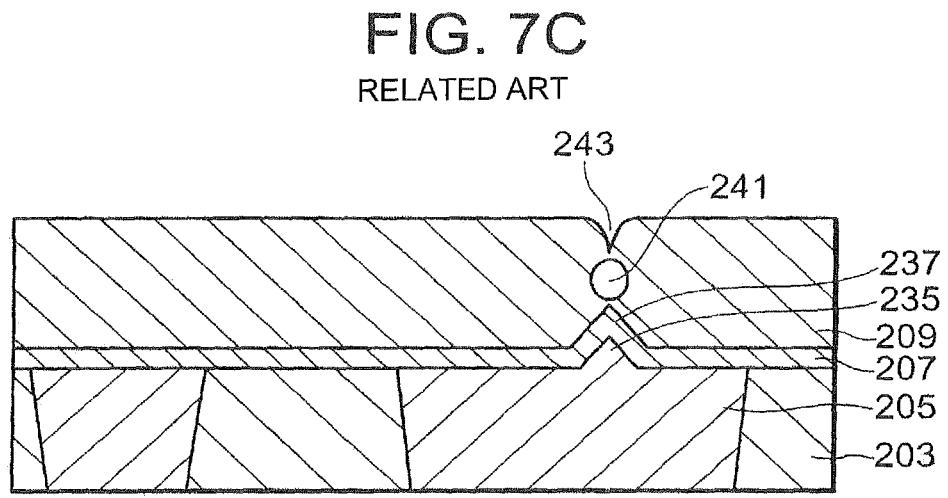
Figure 8A:
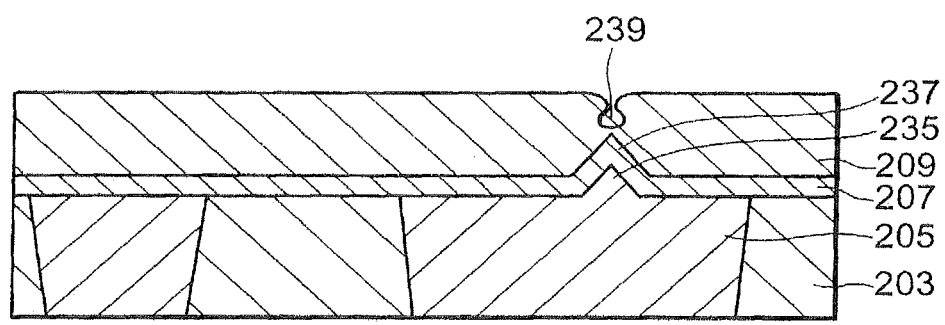
FIGS. 8A and 8B are cross-sectional views showing the process for manufacturing the conventional semiconductor device.
Figure 8B:
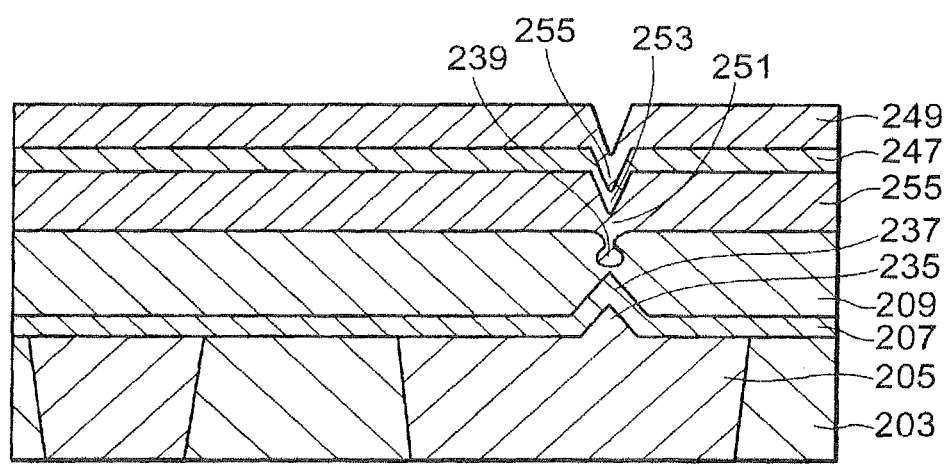
Figure 9:
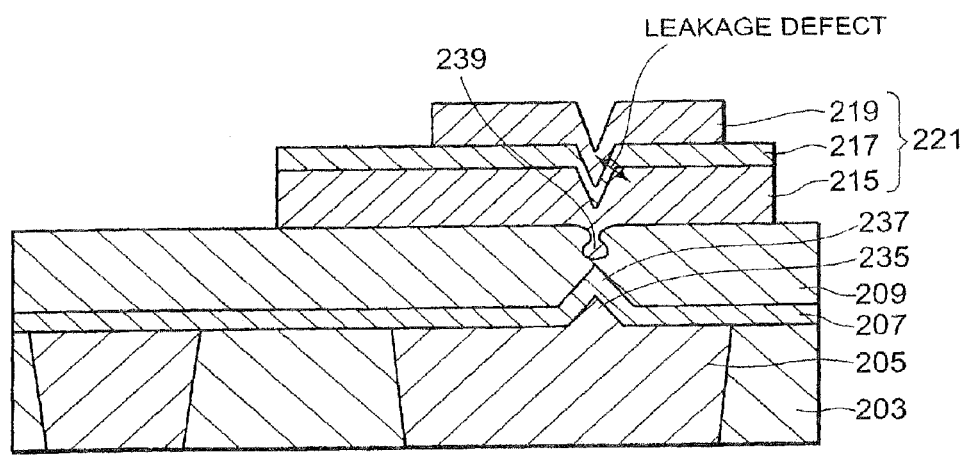
FIG. 9 is a cross-sectional view showing the process for manufacturing the conventional semiconductor device.

FIG. 6 is a graph showing a relationship between a wiring width W (μm) of the first copper wiring 105 and the frequency of occurrence (%) of the protruding portion 135. As is apparent from FIG. 6, when the wiring width of the first copper wiring 105 is smaller than 1 μm, a protrusion causing a defect in the capacitor element 121 hardly occurs. However, when the wiring width is equal to or larger than 1 μm, the frequency of occurrence of the protrusion rapidly increases. Note that FIG. 6 shows an example in the case where a heating temperature at the time of formation of the SiCN film 107 is set to 350° C.

Figure 3C:
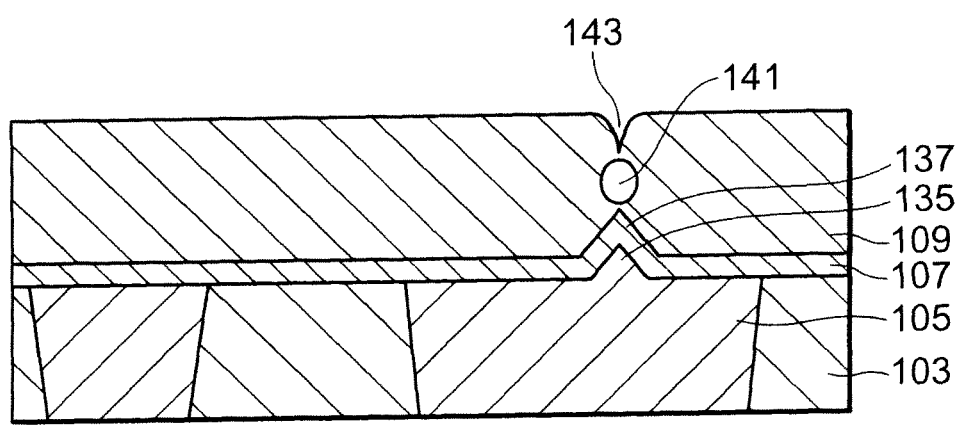

Returning to FIG. 3B, the SiO₂ film 109 is formed on the SiCN film 107 by, for example, the CVD method (FIG. 3C). As shown in FIG. 3C, a cavity portion 141 is produced in the formed SiO₂ film 109 or a recess portion 143 is produced on the upper surface thereof. The cavity portion 141 and the recess portion 143 are produced in a position corresponding to the protruding portion 135, for example, above the protruding portion 135.

Figure 4A:
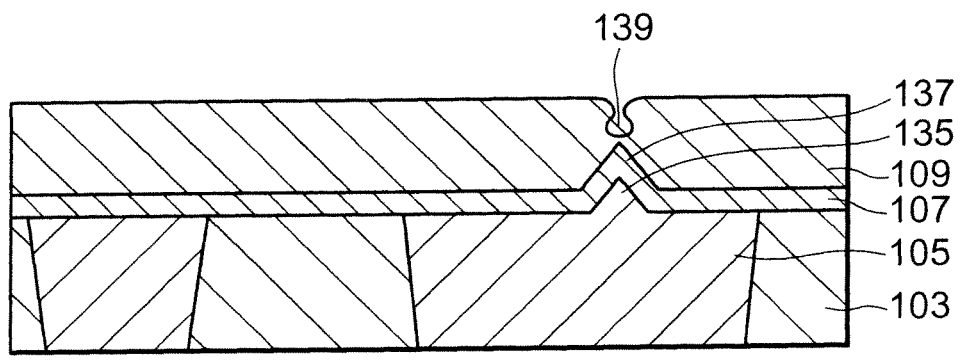
FIGS. 4A and 4B are cross-sectional views showing the process for manufacturing the semiconductor device of FIG. 1.

Next, the upper surface of the SiO₂ film 109 is polished by the CMP method to be planarized (FIG. 4A). Note that the recess portion 139 is left in the planarized upper surface of the SiO₂ film 109. Therefore, when the capacitor element 121 is formed just above the SiO₂ film 109, it is likely to cause poor film formation of the capacitor insulating film 117.

Figure 4B:
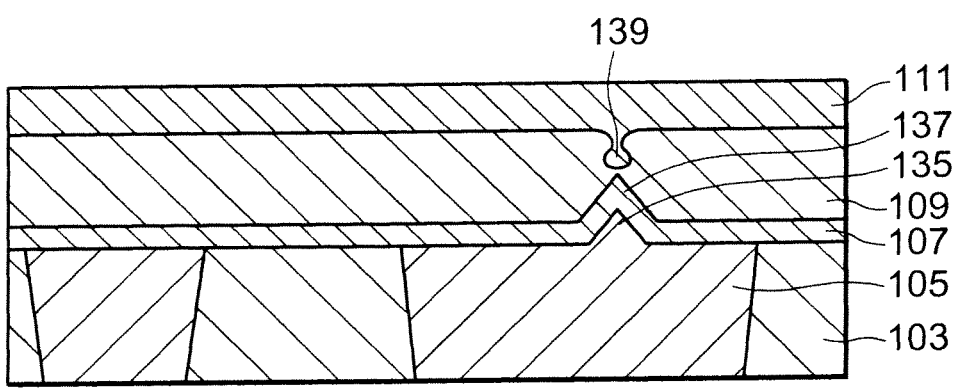

In order to prevent this, the SiO₂ film 111 is further laminated on the polished surface of the SiO₂ film 109 by, for example, the CVD method (FIG. 4B). Depending on the degree of planarization of the upper surface of the SiO₂ film 111, the upper surface of the SiO₂ film 111 may be polished to be planarized by, for example, the CMP method after the formation of the SiO$_2$ film 111 and before the formation of the lower electrode 115.

Figure 5A:
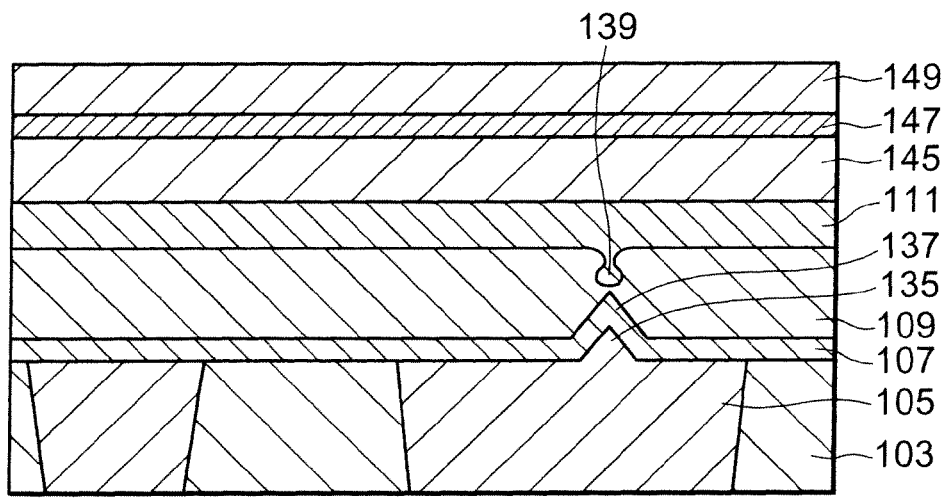
FIGS. 5A and 5B are cross-sectional views showing the process for manufacturing the semiconductor device of FIG. 1.
Figure 5B:
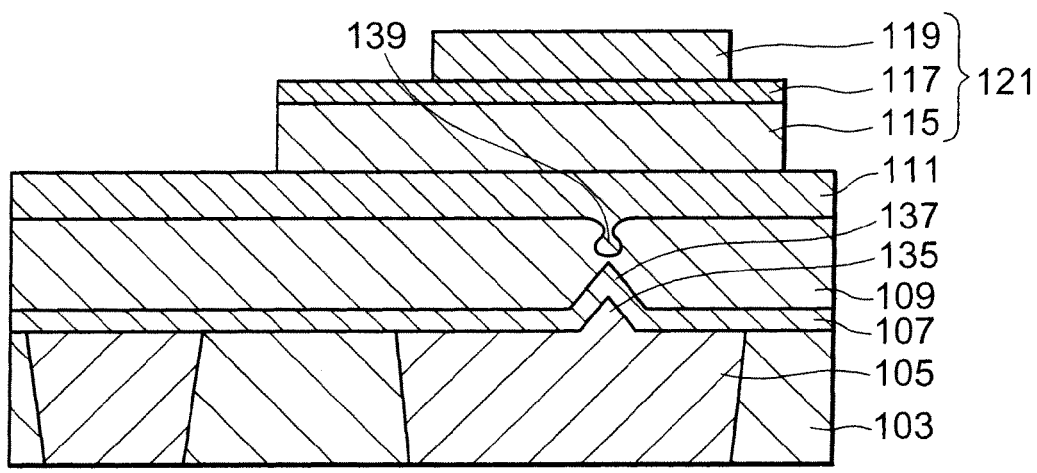

After the above-mentioned steps, the upper surface of the SiO$_2$ film 111 becomes a sufficiently flat state above the protruding portion 135. A conductive film 145 serving as the lower electrode 115, an insulating film 147 serving as the capacitor insulating film 117, and a conductive film 149 serving as the upper electrode 119 are formed in order on the SiO$_2$ film 111 whose surface is planarized (FIG. 5A). The conductive film 145 and the insulating film 147 are processed into a desirable shape, thereby forming the lower electrode 115 and the capacitor insulating film 117. Further, the conductive film 149 is processed into a desirable shape by photolithography and dry etching, thereby forming the upper electrode 119. Therefore, the capacitor element 121 including the lower electrode 115, the capacitor insulating film 117, and the upper electrode 119 is formed (FIG. 5B).

Next, the SiO$_2$ film 113 is formed as an interlayer insulating film by, for example, the CVD method so as to cover the capacitor element 121. Then, the SiO$_2$ film 113 is planarized by the CMP method. A finished film thickness of the SiO$_2$ film 113 is set to, for example, approximately 750 nm to 800 nm. Further, connection holes for the first connection plug 125, the second connection plug 127, and the third connection plug 123 are formed by photolithography and dry etching. Subsequently, the barrier metal film, the Cu seed layer, and the Cu film are formed as in the step of forming the first copper wirings 105. After that, the Cu film is polished by CMP treatment until the surface of the SiO$_2$ film 113 is exposed. Therefore, the first connection plug 125, the second connection plug 127, and the third connection plug 123 are formed.

The SiCN film 129 serving as a diffusion prevention film and the SiO$_2$ film 131 are formed in order on the SiO$_2$ film 113, the first connection plug 125, the second connection plug 127, and the third connection plug 123. Wiring trenches extending through the SiCN film 129 and the SiO$_2$ film 131 are formed by photolithography and dry etching. After that, the second copper wirings 133 connected with the respective connection plugs are formed as in the step of forming the first copper wirings 105. Thus, the semiconductor device 100 shown in FIG. 1 is obtained.

Next, the operation and effect of this embodiment are described.

In this embodiment, the SiO$_2$ films 109 and 111 are laminated between the lower electrode 115 and the first copper wiring 105 formed with the protruding portion 135. At least the upper surface of the SiO$_2$ film 109 is the polished surface. Therefore, the surface of the SiO$_2$ film 111 is sufficiently planarized before the lower electrode 115 is formed on the SiO$_2$ film 111, so an interface between the SiO$_2$ film 111 and the lower electrode 115 is flat. Thus, even when the hillock-shaped protruding portion 135 is produced in a part of the upper surface of the first copper wiring 105, the capacitor element 121 formed in the position overlapped with the protruding portion 135 is not affected by the protruding portion 135. Specifically, it is possible to prevent the capacitor insulating film 117 located above the protruding portion 135 from being reduced in film quality, being not formed, or being electrically broken down. Therefore, the reduction in withstanding voltage of the capacitor insulating film 117 and the occurrence of the leakage defect can be prevented.

As described above, in this embodiment, even when the first copper wiring 105 located just under the capacitor element 121 has the protrusion such as the hillock, the semiconductor device 100 including the capacitor element 121 whose yield and reliability are excellent and the method of manufacturing the semiconductor device 100 are realized because the flatness of the upper surface of the SiO$_2$ film 111 is sufficiently ensured. The operation and effect are remarkably exhibited when a material of the wiring located just under the capacitor element 121 is a copper-containing metal. When the width of the first copper wiring 105 as viewed in cross section is equal to or larger than 1 μm, the operation and effect are more remarkably exhibited.

Further, in this embodiment, the SiO$_2$ film 109 is formed and planarized, and then the SiO$_2$ film 111 is laminated thereon. Therefore, even when the protruding portion 135 is produced in the first copper wiring 105, the surface of the SiO$_2$ film 111 can be made flat while the sum of the thickness of the SiO$_2$ film 109 and the thickness of the SiO$_2$ film 111 is not excessively large. Accordingly, the flatness of the upper surface of the SiO$_2$ film 111 is ensured. In addition, poor formation of the third connection plug 123 extending through the SiO$_2$ films 109 and 111 can be suppressed to easily form the third connection plug 123.

In the semiconductor device 100, the lower electrode 115 is larger in area than the upper electrode 119, so the first connection plug 125 is connected with the portion in which the upper electrode 119 is not provided as viewed from the top of the capacitor element 121. Therefore, the first connection plug 125 can be brought into contact with the lower electrode 115 from the upper side of the semiconductor device 100, that is, from the SiO$_2$ film 113 side. Thus, it is unnecessary to connect the contact plug for the lower electrode 115 with the protruding portion 135 of the first copper wiring 105, with the result that low-resistance and stable contact can be realized.

When the parallel plate type MIM capacitor element is used as the capacitor element 121, the following effect of the present invention is more remarkably exhibited because a bottom area of the capacitor element is wide. That is, it is possible to provide the semiconductor device including the capacitor element whose yield and reliability are excellent and the method of manufacturing the semiconductor device without being affected by the protrusion such as the hillock produced in the first copper wiring 105 located just under the capacitor element.

The embodiment of the present invention is described above with reference the attached drawings. However, the embodiment is an example of the present invention and thus various structures except the structure described above can be employed.

For example, in the embodiment described above, the connection plugs (first connection plug 125, second connection plug 127, and third connection plug 123) and the wirings (first copper wirings 105 and second copper wirings 133) are separately formed by a single damascene method. However, the connection plugs and the wirings may be formed at the same time by a dual damascene method.

Further, in the embodiment, the case where the wirings are made of copper is described. However, the wirings may be made of a copper-containing metal such as a metal which contains Cu as a main component and further contains Al or Ag. In this specification, copper is also included in the "copper-containing metal". The wiring material is not limited to the copper-containing metal. For example, aluminum may be used for the wirings.

Further, in the embodiment, the case where the second insulating film is the SiO$_2$ film 109 is described. However, any type of insulating film which can be planarized by, for example, CMP may be used as the second insulating film. Each of the first, third, and fourth insulating films (SiO$_2$ film 103, SiO$_2$ film 111, and SiO$_2$ film 113) is not limited to an SiO$_2$ film. Examples of each of the first to fourth insulating films include an SiOF film, an organic low-dielectric constant film, an inorganic low-dielectric constant film, and a composite film of those. Each of the low-dielectric constant films is, for example, a film whose relative dielectric constant is equal to or smaller than 2.5. An example of the low-dielectric constant film is a porous insulating film made of SiOC (SiOCH), methylsilsesquioxane (MSQ), methylated hydrogen silsesquioxane (MHSQ), organic polysiloxanes, or the like.

Further, in the embodiment, the case where each of the diffusion prevention film located on the first copper wirings 105 and the diffusion prevention film located on the $SiO_2$ film 113 is the silicon carbonitride film is described. However, the diffusion prevention film material is not limited to this. For example, a silicon nitride film, a silicon carbide film, or a silicon oxynitride film may be used. The diffusion prevention films may be made of the same material or different materials.

Further, in the embodiment, the case where the capacitor element is the parallel plate type MIM capacitor element is described. However, the type of the capacitor element is not limited to particularly the parallel plate type. For example, a trench type capacitor element may be employed. When the trench type capacitor element has a large bottom area and includes a portion overlapped with the wiring of the first wiring layer, the structure and the manufacturing method according to the present invention are effective.

What is claimed is:

1. A method of manufacturing a semiconductor device, said method comprising:
    forming a first insulating film above a semiconductor substrate;
    forming a wiring to be buried in the first insulating film;
    forming a protruding portion in an upper surface of the wiring;
    forming a second insulating film above the first insulating film and the wiring including the protruding portion;
    planarizing a surface of the second insulating film;
    forming a third insulating film on the second insulating film whose surface is planarized;
    forming a lower electrode on the third insulating film;
    forming a capacitor insulating film on the lower electrode; and
    forming an upper electrode on the capacitor insulating film,
    wherein a thickness of the third insulating film is less than a thickness of the second insulating film, and
    wherein the lower electrode abuts the third insulating film.

2. The method according to claim 1, wherein the forming the capacitor insulating film comprises forming the capacitor insulating film in a region which is located on the lower electrode and which includes a position overlapping with the protruding portion.

3. The method according to claim 1, further comprising:
    planarizing the third insulating film between said forming the third insulating film and said forming the lower electrode.

4. The method according to claim 1, wherein, in a plan view, the capacitor insulating film overlaps with the wiring.

5. The method according to claim 1, further comprising:
    forming a diffusion prevention film between the first insulating film and the second insulating film to cover the upper surface of the wiring.

6. The method according to claim 5, wherein the diffusion prevention film protrudes toward a side of the second insulating film to correspond to a shape of the protruding portion.

7. The method according to claim 1, further comprising:
    after forming the upper electrode, forming a fourth insulating film and planarizing a surface of the fourth insulating film; and
    forming a plug in the fourth insulating film, the third insulating film, and the second insulating film.

8. The method according to claim 7, wherein the plug is formed by a damascene method.

9. The method according to claim 7, wherein the plug is formed by a dual damascene method.

10. The method according to claim 1, further comprising:
    after forming the upper electrode, forming a plug in the third insulating film and the second insulating film.

11. The method according to claim 1, wherein the third insulating film is disposed on the surface of the second insulating film that is planarized.

12. The method according to claim 1, wherein a lower surface of the third insulating film abuts the surface of the second insulating film that is planarized.

* * * * *